United States Patent
Hisakado et al.

(12)

(10) Patent No.: US 11,396,700 B2
(45) Date of Patent: Jul. 26, 2022

(54) SUBSTRATE PROCESSING APPARATUS

(71) Applicant: Kokusai Electric Corporation, Tokyo (JP)

(72) Inventors: Sadao Hisakado, Toyama (JP); Tomoshi Taniyama, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 17/144,927

(22) Filed: Jan. 8, 2021

(65) Prior Publication Data
US 2021/0147978 A1 May 20, 2021

Related U.S. Application Data

(63) Continuation of application No. PCT/JP2018/029277, filed on Aug. 3, 2018.

(51) Int. Cl.
| | |
|---|---|
| *C23C 16/40* | (2006.01) |
| *C23C 16/44* | (2006.01) |
| *C23C 16/455* | (2006.01) |
| *C23C 16/458* | (2006.01) |

(52) U.S. Cl.
CPC ...... *C23C 16/4412* (2013.01); *C23C 16/4408* (2013.01); *C23C 16/4587* (2013.01); *C23C 16/45563* (2013.01)

(58) Field of Classification Search
CPC ............ C23C 16/4412; C23C 16/4408; C23C 16/45563; C23C 16/4587; C23C 16/45523; C23C 16/45578; C23C 16/46; C23C 16/0209; C23C 16/45544; H01L 21/67098; H01L 21/0217; H01L 21/0228

USPC .............. 118/719; 156/345.31, 345.32
See application file for complete search history.

(56) References Cited

U.S. PATENT DOCUMENTS

| | | | |
|---|---|---|---|
| 5,478,397 A | 12/1995 | Shibata et al. | |
| 8,002,895 B2 * | 8/2011 | Inoue ................... | C23C 16/345 118/715 |
| 9,666,459 B2 * | 5/2017 | Yang ................... | C23C 16/4405 |
| 10,508,336 B2 * | 12/2019 | Nakada ............ | H01L 21/67739 |

(Continued)

FOREIGN PATENT DOCUMENTS

| | | |
|---|---|---|
| JP | H7-6956 A | 1/1995 |
| WO | 2017037937 A | 3/2017 |

*Primary Examiner* — Rudy Zervigon
(74) *Attorney, Agent, or Firm* — Edell, Shapiro & Finnan, LLC

(57) ABSTRACT

According to the technique of the disclosure, there is provided a substrate processing apparatus including: a substrate retainer; a heat insulating assembly; a process chamber; a gas supplier including openings bored toward the wafer; a gas discharger including main exhaust openings bored toward the wafer; an exhaust port; an intermediate exhaust opening provided on a side wall of the process chamber at a position facing the heat insulating assembly; and a supply chamber exhaust port provided on the side wall of the process chamber at a height corresponding to the intermediate exhaust opening. The heat insulating assembly includes a constriction at a position corresponding to the intermediate exhaust opening, wherein its outer diameter is smaller than that of a portion of the heat insulating assembly above the position and that of another portion of the heat insulating assembly below the position.

13 Claims, 9 Drawing Sheets

(56) References Cited

U.S. PATENT DOCUMENTS

| | | | |
|---|---|---|---|
| 10,593,572 B2* | 3/2020 | Saido | F27B 9/30 |
| 10,615,061 B2* | 4/2020 | Saido | H01L 21/67109 |
| 10,689,758 B2* | 6/2020 | Yoshida | C23C 16/345 |
| 10,811,271 B2* | 10/2020 | Yoshida | C23C 16/455 |
| 10,950,457 B2* | 3/2021 | Yoshida | H01L 21/67109 |
| 11,041,240 B2* | 6/2021 | Takagi | H01L 21/02164 |
| 11,155,920 B2* | 10/2021 | Yoshida | C23C 16/45574 |
| 2003/0183614 A1* | 10/2003 | Yamaguchi | C30B 31/10 219/390 |
| 2004/0025786 A1* | 2/2004 | Kontani | C23C 16/45546 118/715 |
| 2005/0098107 A1* | 5/2005 | Du Bois | C23C 16/4584 118/715 |
| 2007/0010072 A1* | 1/2007 | Bailey | C23C 16/45504 438/478 |
| 2007/0062448 A1* | 3/2007 | Maeda | C23C 16/45574 118/715 |
| 2007/0137794 A1* | 6/2007 | Qiu | C23C 16/46 156/345.33 |
| 2007/0157882 A1* | 7/2007 | Ozaki | H01L 21/02238 118/715 |
| 2009/0095422 A1* | 4/2009 | Sugishita | H01L 21/67248 156/345.27 |
| 2009/0151632 A1* | 6/2009 | Okuda | C23C 16/45546 118/666 |
| 2012/0100722 A1* | 4/2012 | Asai | C23C 16/4408 438/758 |
| 2014/0261174 A1* | 9/2014 | Yang | C23C 16/4408 118/715 |
| 2014/0357058 A1* | 12/2014 | Takagi | C23C 16/402 438/478 |
| 2017/0037512 A1* | 2/2017 | Saido | C23C 16/4408 |
| 2017/0294318 A1* | 10/2017 | Yoshida | H01L 21/31 |
| 2018/0187307 A1* | 7/2018 | Yoshida | C23C 16/345 |
| 2019/0035654 A1* | 1/2019 | Saido | H01L 21/67109 |
| 2020/0149159 A1* | 5/2020 | Okajima | C23C 16/4405 |
| 2020/0240019 A1* | 7/2020 | Yoshida | C23C 16/45578 |
| 2021/0147978 A1* | 5/2021 | Hisakado | C23C 16/4408 |

\* cited by examiner

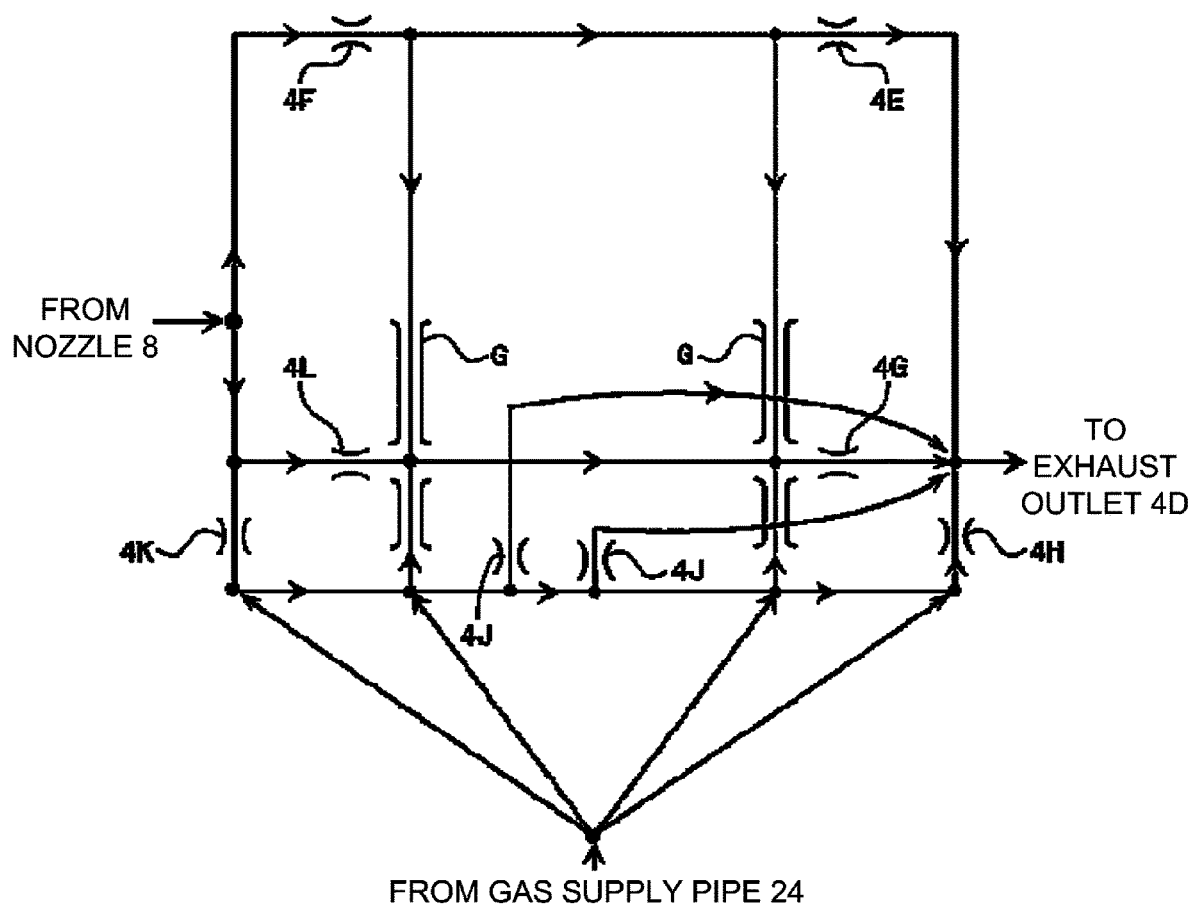

SUBSTRATE PROCESSING APPARATUS

CROSS REFERENCE TO RELATED APPLICATIONS

This application is a continuation of International Application No. PCT/JP2018/029277, filed on Aug. 3, 2018, the entire contents of which are hereby incorporated by reference.

TECHNICAL FIELD

The present disclosure relates to a substrate processing apparatus.

BACKGROUND

In a heat treatment process of a substrate (also referred to as a "wafer"), which is one of manufacturing processes of a semiconductor device, a substrate processing apparatus such as a vertical type substrate processing apparatus may be used. For example, in the vertical type substrate processing apparatus, a plurality of substrates are charged into a substrate retainer of the vertical type substrate processing apparatus and supported in a vertical direction by the substrate retainer. After the substrate retainer is loaded into a process chamber of the vertical type substrate processing apparatus, a process gas is introduced into the process chamber while the plurality of the substrates are heated by a heater installed at an outside of the process chamber to thereby perform a substrate processing such as a film-forming process of forming a film on the plurality of the substrates.

However, due to sudden pressure fluctuations, the film may crack at a lower portion of a furnace opening and cracks of the film may be rolled up. As a result, particles may fall on the plurality of the substrates.

SUMMARY

Described herein is a technique capable of reducing the aforementioned particles in a substrate processing.

According to one aspect of the technique of the present disclosure, there is provided a processing apparatus including: a substrate retainer configured to support a plurality of wafers arranged at a predetermined interval along a predetermined axis; a heat insulating assembly provided below the substrate retainer; a process chamber formed in a tubular shape and configured to accommodate the substrate retainer and the heat insulating assembly; a gas supplier configured to fluidically communicate with the process chamber through one or more openings bored toward an edge of each of the plurality of the wafers in the process chamber; a gas discharger configured to fluidically communicate with the process chamber through one or more main exhaust openings bored toward the edge of each of the wafers; an exhaust port configured to communicate with the gas discharger and to discharge an inner atmosphere of the process chamber; an intermediate exhaust opening provided on a side wall of the process chamber and configured to communicate with the process chamber and the exhaust port at a position facing the heat insulating assembly; and a supply chamber exhaust port provided on the side wall of the process chamber and configured to communicate with the process chamber and the gas supplier at a height corresponding to the intermediate exhaust opening, wherein the heat insulating assembly is provided with a constriction at a position corresponding to the intermediate exhaust opening, and an outer diameter of the constriction is smaller than that of a portion of the heat insulating assembly above the position corresponding to the intermediate exhaust opening and that of another portion of the heat insulating assembly below the position corresponding to the intermediate exhaust opening.

BRIEF DESCRIPTION OF THE DRAWINGS

FIG. 9 schematically illustrates a model of an exhaust path in the reaction tube according to the embodiments described herein.

DETAILED DESCRIPTION

Embodiments

Hereinafter, one or more embodiments (hereinafter, simply referred to as "embodiments") according to the technique of the present disclosure will be described with reference to the drawings.

Figure 1:
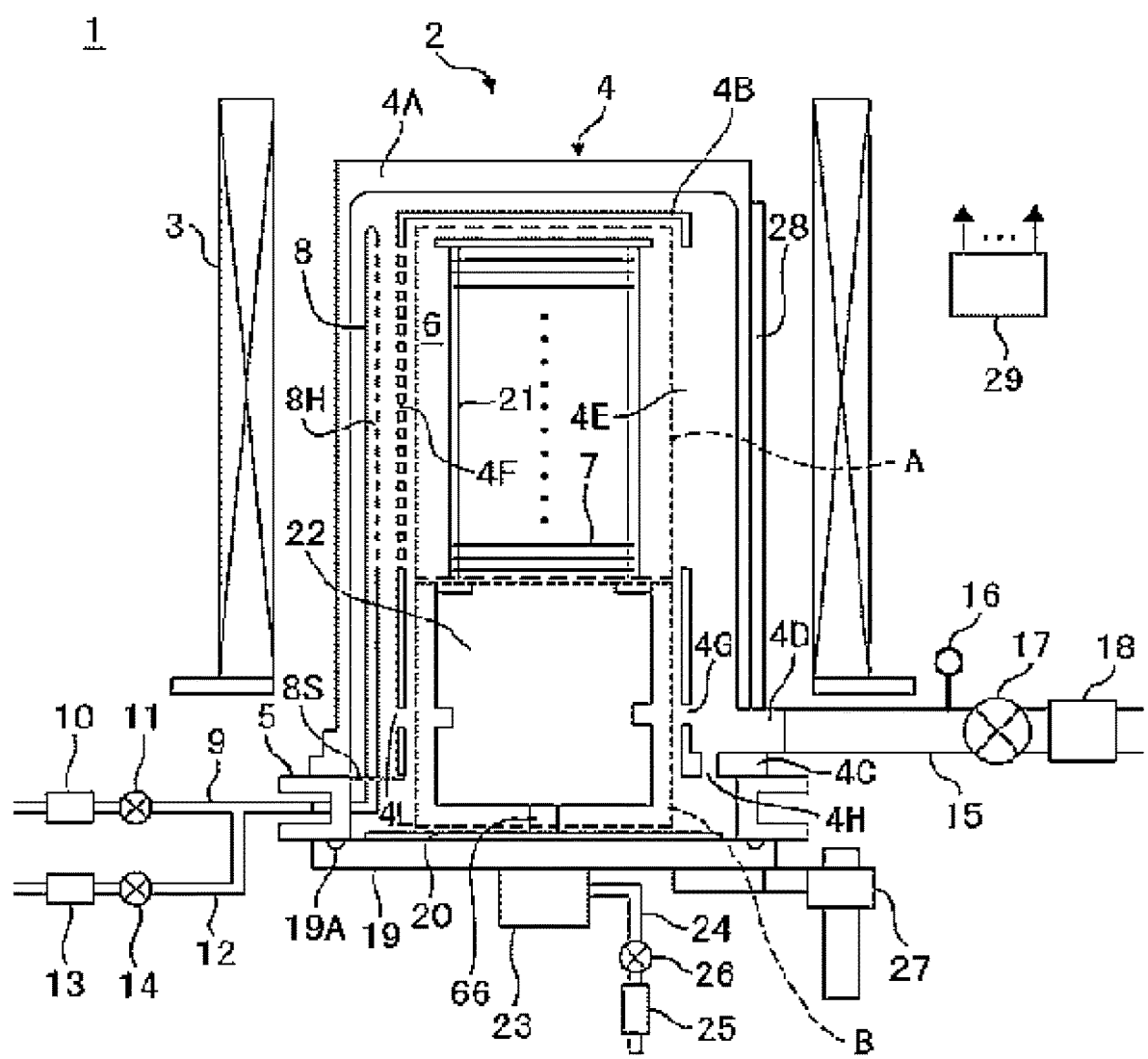
FIG. 1 schematically illustrates a vertical cross-section of a substrate processing apparatus according to one or more embodiments described herein.

As shown in FIG. 1, a substrate processing apparatus 1 according to the embodiments described herein is configured as a vertical type heat treatment apparatus capable of performing a heat treatment process in manufacturing processes of a semiconductor integrated circuit (IC). The substrate processing apparatus 1 includes a process furnace 2. The process furnace 2 includes a heater 3. In order to uniformly heat the process furnace 2, the heater 3 is constituted by a plurality of heating structures. The heater 3 is of a cylindrical shape, and is installed perpendicular to an installation floor of the substrate processing apparatus 1 while being supported by a heater base (not shown) serving as a support plate. The heater 3 also functions as an activator (also referred to as is an "exciter") of activating (exciting) a gas such as a process gas by heat as described later.

A reaction tube 4 is provided on an inner side of the heater 3. A reaction vessel (also referred to as a "process vessel") is constituted by the reaction tube 4. For example, the reaction tube 4 is made of a heat resistant material such as quartz ($SiO_2$) and silicon carbide (SiC). The reaction tube 4 is of a cylindrical shape with an open lower end and a closed upper end. The reaction tube 4 is embodied by a double tube structure including an outer tube 4A and an inner tube 4B that are coupled to each other at a flange 4C. The flange 4C is provided at a lower portion of the reaction tube 4. Upper ends of the outer tube 4A and the inner tube 4B are closed and a lower end of the inner tube 4B is open. The flange 4C protrudes outward from an outer periphery of the reaction tube 4. An outer diameter of the flange 4C is greater than an outer diameter of the outer tube 4A. An exhaust outlet 4D serving as an exhaust port communicating with an inside of the outer tube 4A is provided in the vicinity of the lower end of the reaction tube 4. The reaction tube 4 including the above described components such as the outer tube 4A and the inner tube 4B is formed as a single body of a single material. In other words, the flange 4C is formed as a single body on outer peripheries of lower ends of a process chamber 6, a plurality of nozzle chambers 42 and an exhaust space S described later. The outer tube 4A is relatively thick so as to withstand a pressure difference when the inside thereof is exhausted to vacuum.

A manifold 5 of a cylindrical shape or of a truncated cone shape is made of a metal or quartz, and is provided to support the lower end of the reaction tube 4. An inner diameter of the manifold 5 is greater than an inner diameter of the reaction tube 4 (and an inner diameter of the flange 4C). Thereby, an annular space described later is defined between the lower end of the reaction tube 4 (that is, the flange 4C) and a seal cap 19 described later. The space (the annular space) and/or related components surrounding the space may also be collectively referred to as a "furnace opening".

The inner tube 4B is provided with a main exhaust opening 4E and a plurality of supply slits (slit openings) 4F. The plurality of the supply slits 4F may also be referred to as "supply slits 4F". The main exhaust opening 4E is provided at the inner tube 4B closer to a center of the reaction tube 4 than the exhaust outlet 4D. The main exhaust opening 4E is configured to communicate with an inside and an outside of the inner tube 4B on a side thereof. The supply slits 4F are provided (bored) at the inner tube 4B at positions opposite to the main exhaust opening 4E. The main exhaust opening 4E is a single vertically elongated opening that opens to a region where a plurality of wafers (also simply referred to as "wafers") including a wafer 7 are disposed. Each of the supply slits 4F is a slit extending in a circumferential direction of the inner tube 4B. The supply slits 4F are arranged both in the horizontal direction and in the vertical direction so as to face each of the wafers including the wafer 7.

In addition, the inner tube 4B is provided with an intermediate exhaust opening 4G. In other words, the intermediate exhaust opening 4G is provided on a side wall of the process chamber 6. The intermediate exhaust opening 4G is provided at the inner tube 4B closer to the center of the reaction tube 4 than the exhaust outlet 4D and closer to a lower end opening of the reaction tube 4 than the main exhaust opening 4E. The intermediate exhaust opening 4G is configured to communicate with the process chamber 6 and the exhaust space (also referred to as an "exhaust chamber") S. The flange 4C is also provided with a bottom exhaust port 4H, a plurality of bottom exhaust ports (also simply referred to as "bottom exhaust ports") 4J (shown in FIG. 3) and a nozzle introduction hole 4K (shown in FIG. 5). The bottom exhaust port 4H and the bottom exhaust ports 4J are configured to communicate with the process chamber 6 and a lower end of the exhaust space S. That is, the lower end of the exhaust space S is closed by the flange 4C except where the bottom exhaust port 4H and the bottom exhaust ports 4J are provided. The intermediate exhaust opening 4G and the bottom exhaust port 4H are configured to mainly exhaust a shaft purge gas described later.

In the exhaust space S between the outer tube 4A and the inner tube 4B, one or more nozzles 8 configured to supply the process gas such as a source gas are provided corresponding to the positions of the supply slits 4F. One or more gas supply pipes 9 configured to supply the process gas such as the source gas are connected to the one or more nozzles 8 through the manifold 5, respectively.

A mass flow controller (MFC) 10 serving as a flow rate controller and a valve serving as an opening/closing valve are sequentially installed on flow paths of the one or more gas supply pipes 9, respectively, from upstream sides to downstream sides thereof. One or more gas supply pipes 12 configured to supply an inert gas are connected to the one or more gas supply pipes 9, respectively, at a downstream side of a valve 11. An MFC 13 and a valve 14 are sequentially installed at the one or more gas supply pipes 12, respectively, from upstream sides to downstream sides thereof. Hereinafter, the one or more nozzles 8 may also be collectively referred to as a "nozzle 8", the one or more gas supply pipes 9 may also be collectively referred to as a "gas supply pipe 9", and the one or more gas supply pipes 12 may also be collectively referred to as a "gas supply pipe 12". A process gas supplier serving as a process gas supply system is constituted mainly by the gas supply pipe 9, the MFC 10 and the valve 11. In addition, a gas supplier serving as a gas supply system is mainly constituted by the process gas supplier the MFC 13 and the valve 14.

The nozzle 8 serving as an injector of a tubular shape is provided in the plurality of the nozzle chambers 42 described later so as to extend straight from a lower portion of the reaction tube 4 to an upper portion of the reaction tube 4. The plurality of the nozzle chambers 42 may also simply be referred to as "nozzle chambers 42". A nozzle hole or a plurality of nozzle holes (also simply referred to as "nozzle holes") 8H configured to supply the gas such as the process gas may be provided on an upper end or a side surface of the nozzle 8. The nozzle 8 may be configured to supply the gas through the nozzle holes (also referred to as "discharge ports") 8H provided at a height same as or higher than a lowermost wafer among the wafers including the wafer 7. A flow rate of the gas such as the process gas supplied through the nozzle holes 8H is set such that a downward flow of the gas from each of the nozzle holes 8H to a supply chamber exhaust port 4L is generated at a timing when a temporal fluctuation of a pressure (such as a pressure in the vicinity of the furnace opening) is maximized during processing the plurality of the wafers. The nozzle holes 8H correspond to the openings of the supply slits 4F, respectively. The nozzle holes 8H are open toward the center of the reaction tube 4. As a result, it is possible to inject the gas toward the wafers including the wafer 7 through the inner tube 4B.

An exhaust pipe 15 configured to exhaust an inner atmosphere of the process chamber 6 is connected to the exhaust outlet 4D. A vacuum pump 18 serving as a vacuum exhaust apparatus is connected to the exhaust pipe 15 through a pressure sensor 16 and an APC (Automatic Pressure Controller) valve 17. The pressure sensor 16 serves as a pressure detector (also referred to as a "pressure meter") to detect an inner pressure of the process chamber 6, and the APC valve 17 serves as a pressure regulator (also referred to as a "pressure controller"). With the vacuum pump 18 in operation, the APC valve 17 may be opened or closed to exhaust (vacuum-exhaust) the process chamber 6 or stop the vacuum exhaust. With the vacuum pump 18 in operation, an opening degree of the APC valve 17 may be adjusted based on pressure information detected by the pressure sensor 16, in order to control (adjust) the inner pressure of the process chamber 6. An exhauster (also referred to as an "exhaust system") is constituted mainly by the exhaust pipe 15, the APC valve 17 and the pressure sensor 16. The exhauster may further include the vacuum pump 18.

The seal cap 19 serving as a furnace opening lid capable of airtightly sealing a lower end opening of the manifold 5 is provided under the manifold 5. The seal cap 19 is made of a metal such as SUS (stainless steel) and a nickel-base alloy, and is of a disk shape. An O-ring 19A serving as a seal is provided on an upper surface of the seal cap 19 so as to be in contact with the lower end of the manifold 5.

A cover plate 20 is provided on the upper surface of the seal cap 19 so as to protect a portion of the seal cap 19 inner than an inner periphery of the lower end of the manifold 5. The cover plate 20 is made of a heat and corrosion resistant material such as quartz, sapphire and SiC, and is of a disk shape. Since the cover plate 20 does not require much mechanical strength, the cover plate 20 may be formed with a small thickness. In addition, according to the embodiments, the cover plate 20 does not have to be prepared independently of the seal cap 19. For example, the cover plate 20 may be embodied by a film or a layer such as a nitride film coated on an inner surface of the seal cap 19 or a nitride film formed by modifying the inner surface of the seal cap 19. The cover plate 20 may further include a wall extending along an inner surface of the manifold 5 from a circumferential edge of the cover plate 20.

A boat 21 serving as a substrate retainer is configured to align the wafers including the wafer 7, for example, from 25 to 200 wafers in the vertical direction and configured to support the wafers in a multistage manner along a predetermined axis, while the wafers are horizontally oriented with their centers aligned with each other. That is, the boat 21 supports (accommodates) the wafers including the wafer 7 with predetermined intervals therebetween. The boat 21 is made of a heat resistant material such as quartz and SiC. It may be preferable for the reaction tube 4 to have a minimum inner diameter that allows the boat 21 to be safely loaded (transferred) into the reaction tube 4 and unloaded (transferred) out of the reaction tube 4.

A heat insulating assembly 22 described later is disposed (provided) below the boat 21. The heat insulating assembly 22 is embodied by a structure in which conduction or transmission of the heat tends to reduce in the vertical direction, and usually a cavity is provided in the heat insulating assembly 22. It is possible to purge an inside of the heat insulating assembly 22 with the shaft purge gas. The upper portion of the reaction tube 4 where the boat 21 is disposed may be referred to as a "process region A", and the lower portion of the reaction tube 4 where the heat insulating assembly 22 is disposed may be referred to as a "heat insulating region B".

A rotator 23 configured to rotate the boat 21 is provided under the seal cap 19 opposite to the process chamber 6. A gas supply pipe 24 of the shaft purge gas is connected to the rotator 23. An MFC 25 and a valve 26 are sequentially installed at the gas supply pipe 24 from an upstream side to a downstream side of the gas supply pipe 24. One purpose of the shaft purge gas is to protect an inside of the rotator 23 (for example, bearings) from the gas such as a corrosive gas used in the process chamber 6. The shaft purge gas is discharged (exhausted) from the rotator 23 along a shaft of the rotator 23 and is guided into the heat insulating assembly 22. A purge gas supplier serving as a purge gas supply system is constituted mainly by the gas supply pipe 24, the MFC 25 and the valve 26. The purge gas supplier is configured to supply the shaft purge gas to the heat insulating assembly 22 through a lower portion of the heat insulating assembly 22.

A boat elevator 27 is provided outside the reaction tube 4 vertically below the reaction tube 4. The boat elevator 27 serves as an elevator (which is a transfer device) capable of elevating and lowering the seal cap 19. When the seal cap 19 is moved upward or downward by the boat elevator 27, the boat 21 supported by the seal cap 19 and the wafers including the wafer 7 accommodated in the boat 21 may be transferred (loaded) into the process chamber 6 or be transferred (unloaded) out of the process chamber 6. There may be provided a shutter (not shown) configured to close the lower end opening of the manifold 5 instead of the seal cap 19 while the seal cap 19 is being lowered to a lowest position thereof.

A temperature sensor 28 is installed on an outer wall of the outer tube 4A. The temperature sensor 28 may be embodied by a plurality of thermocouples arranged in a vertical array. The state of electric conduction to the heater 3 may be adjusted based on temperature information detected by the temperature sensor 28 such that a desired temperature distribution of the inner temperature of the process chamber 6 can be obtained.

A controller 29 is constituted by a computer configured to control the entire substrate processing apparatus 1. The controller 29 is electrically connected to the components of the substrate processing apparatus 1 such as the MFCs 10 and 13, the valves 11 and 14, the pressure sensor 16, the APC valve 17, the vacuum pump 18, the heater 3, a cap heater 34 (shown in FIG. 2), the temperature sensor 28, the rotator 23 and the boat elevator 27, and is configured to receive signals from the components described above or to control the components described above.

Figure 2:
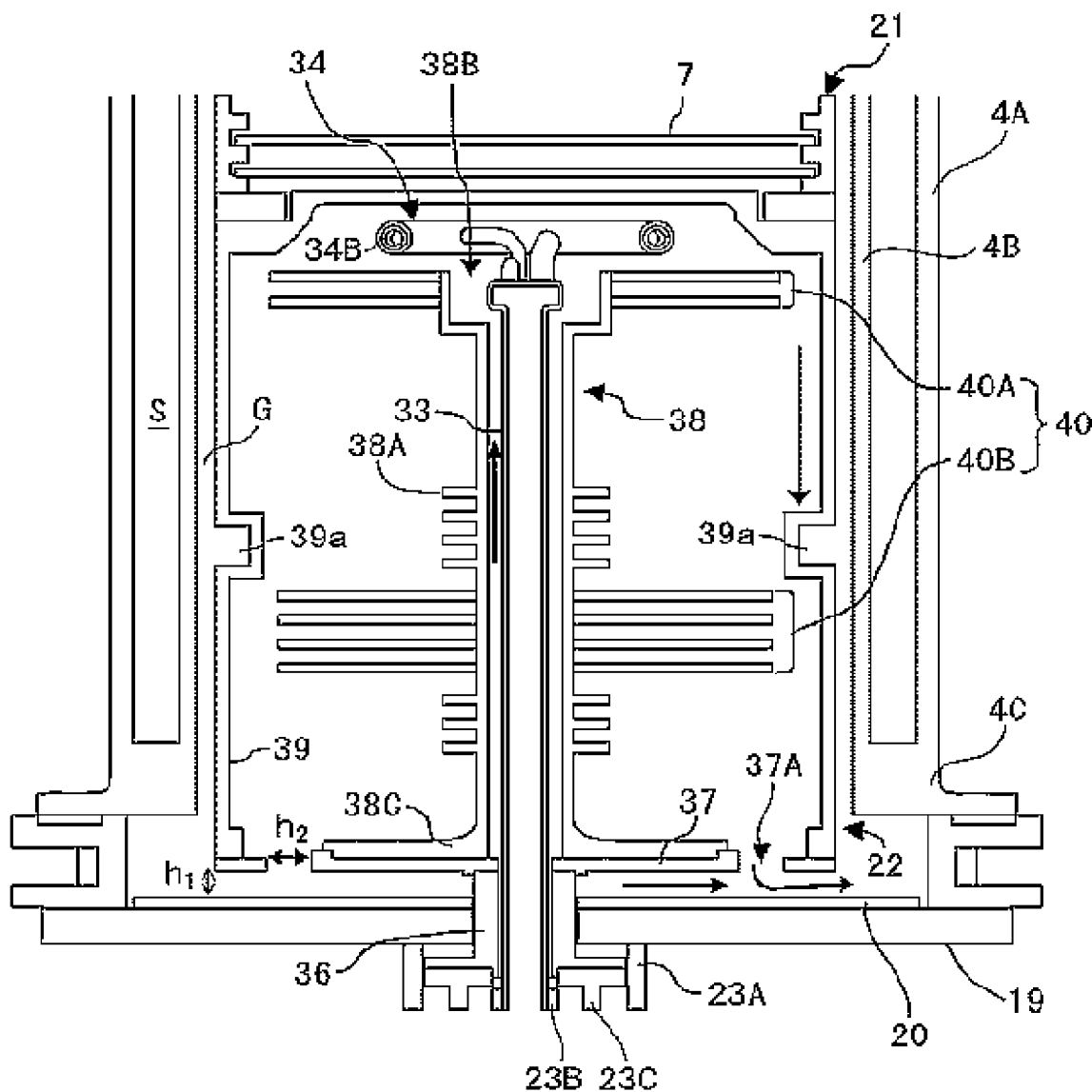
FIG. 2 schematically illustrates a vertical cross-section of a heat insulating assembly of the substrate processing apparatus according to the embodiments described herein.

Subsequently, the heat insulating assembly 22 will be described with reference to FIG. 2. The heat insulating assembly 22 is constituted by a rotating table 37, a heat insulator retainer 38, a cylinder 39 and a heat insulator 40. The rotating table 37 serves as a bottom plate (that is, a support plate). The heat insulating assembly 22 may further includes the cap heater 34.

The rotating table 37 is of a disk shape. A through-hole through which a sub heater column 33 penetrates the rotating table 37 is provided at a center of the rotating table 37. The rotating table 37 is placed on an upper end of a rotating shaft 36, and is fixed to the cover plate 20 with a predetermined distance (gap) h1 therebetween. A plurality of exhaust holes (also simply referred to as "exhaust holes") 37A with a diameter (width) h2 is provided at the rotating table 37 in a rotationally symmetrical arrangement in the vicinity of an edge of the rotating table 37. As a result, the bottom of the heat insulating assembly 22 is capable of being separated. The heat insulator retainer 38 and the cylinder 39 are placed concentrically on an upper surface of the rotating table 37 and fixed by components such as screws. The heat insulator retainer 38 is configured to support the heat insulator 40.

The heat insulator retainer 38 is of a cylindrical shape. A cavity through which the sub heater column 33 penetrates the heat insulator retainer 38 is provided at a center of the heat insulator retainer 38. A flow path, whose cross-section is of annular shape, configured to supply the shaft purge gas upward in the heat insulating assembly 22 is provided between an inner periphery of the heat insulator retainer 38 and the sub heater column 33. The heat insulator retainer 38 is provided with a pedestal 38C of an outward-extending flange shape at a lower end of the heat insulator retainer 38. An outer diameter of the pedestal 38C is smaller than a diameter of the rotating table 37. An upper end of the heat insulator retainer 38 is configured as a supply port 38B of the shaft purge gas. An upper end portion of the supply port 38B expands in a radical direction so as to accommodate the sub heater column 33 protruding outward near the upper end portion of the supply port 38B.

A plurality of heat reflecting plates (also simply referred to as "heat reflecting plates") 40A and a plurality of heat insulating plates (also simply referred to as "heat insulating plates") 40B serving as the heat insulator 40 are coaxially arranged on a column of the heat insulator retainer 38.

An outer diameter of the cylinder 39 is set such that a gap G between the inner tube 4B and the cylinder 39 becomes a predetermined value (distance). It is preferable that the gap G is narrow in order to suppress the process gas and the shaft purge gas from passing therethrough. For example, the gap G preferably ranges from 7.5 mm to 15 mm. An upper end of the cylinder 39 is closed by a flat plate, and the boat 21 is installed on the flat plate. A diameter of the cylinder 39 is greater than a diameter of the wafer 7 and smaller than an inner diameter of the process chamber 6. The cylinder 39 is of a tubular structure. However, a constriction 39a, which corresponds to a narrowed outer circumference of a part of the cylinder 39 (wherein an outer diameter of the constriction 39a is smaller than that of an upper portion of the cylinder 39 and smaller than that of a lower portion of the cylinder 39), is provided at the same height as the exhaust outlet 4D, the intermediate exhaust opening 4G and the supply chamber exhaust port 4L. In other words, the supply chamber exhaust port 4L, the constriction 39a, the intermediate exhaust opening 4G and the exhaust outlet 4D are arranged along a straight line. In addition, a center of each of the wafers 7 may also be located on the straight line described above. The constriction 39a is located above the heat insulating plates 40B and below the heat reflecting plates 40A, and an inner diameter of the constriction 39a is greater than diameters of the heat reflecting plates 40A and the heat insulating plates 40B.

A casing (also referred to as a "body") 23A of the rotator 23 is airtightly fixed to a lower surface of the seal cap 19. From an inside of the casing 23A, an inner shaft 23B of a cylindrical shape and an outer shaft 23C of a cylindrical shape are arranged in this order coaxially in the casing 23A. A diameter of the outer shaft 23C is greater than that of the inner shaft 23B. The outer shaft 23C coupled to the rotating shaft 36 may be rotatably supported by bearings (not shown) interposed between the outer shaft 23C and the casing 23A. The inner shaft 23B coupled to the sub heater column 33 is fixed to the casing 23A so that it cannot rotate.

The sub heater column 33 is vertically inserted inside the inner shaft 23B. For example, the sub heater column 33 is a quartz pipe configured to support the cap heater 34 concentrically at an upper end thereof. The cap heater 34 serves as an auxiliary heater. The cap heater 34 is configured by forming a circular tube in an annular shape, and a heating wire coil 34B is accommodated in an inside of the cap heater 34 isolated from an outside of the cap heater 34. The heating wire coil 34B and a lead wire (not shown) of a temperature sensor (not shown) associated with the heating wire coil 34B are taken out of the seal cap 19 through the sub heater column 33.

The shaft purge gas introduced into the casing 23A by the gas supply pipe 24 flows upward on an inner side and an outer side of the rotating shaft 36. The shaft purge gas supplied into the inner side the rotating shaft 36 flows upward along a flow path between the heat insulator retainer 38 and the sub heater column 33. After the shaft purge gas is ejected through the supply port 38B, the shaft purge gas flows downward in a space between the heat insulator retainer 38 and an inner wall of the cylinder 39, and is exhausted out of the heat insulating assembly 22 through the exhaust holes 37A. The shaft purge gas supplied into the outer side the rotating shaft 36 flows between the rotating shaft 36 and the cover plate 20 while diffusing in a radial direction, and then joins the shaft purge gas exhausted through the exhaust holes 37A to thereby purge the furnace opening.

Figure 3:
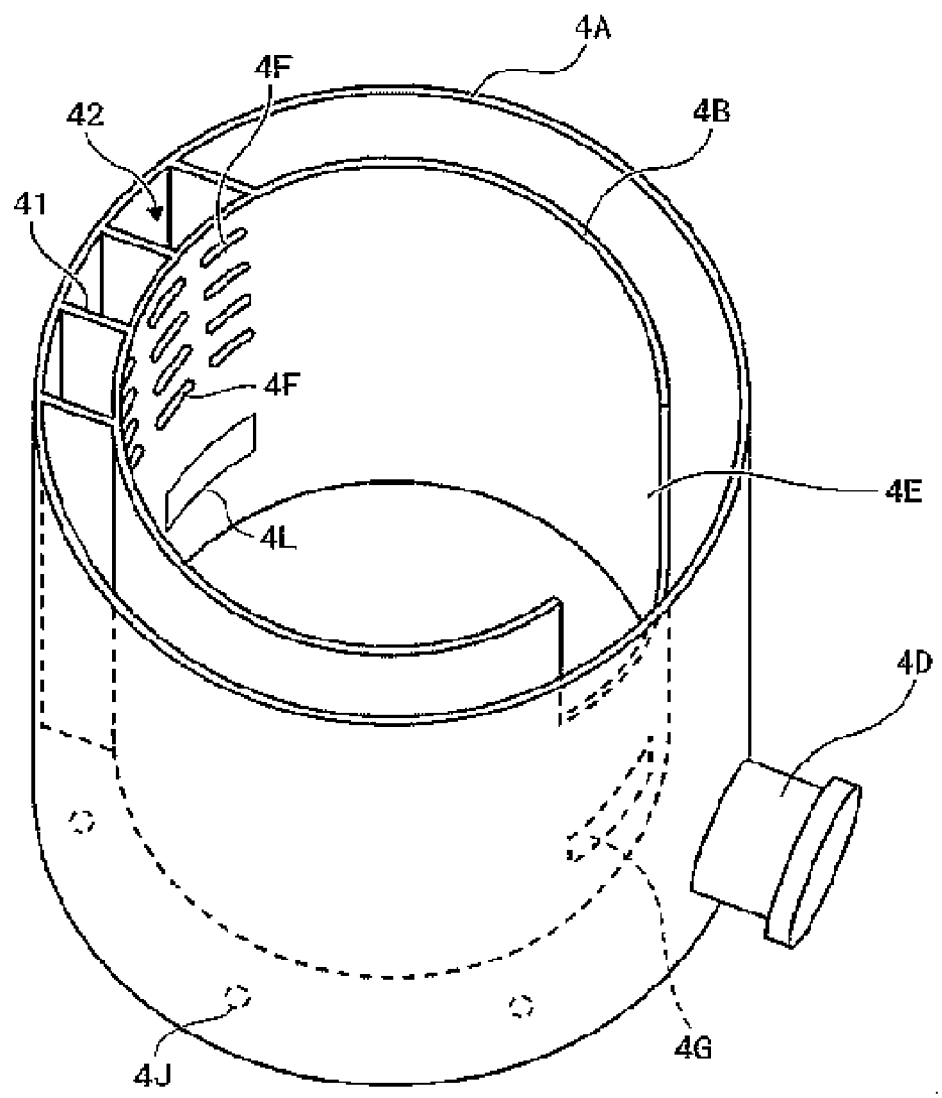
FIG. 3 is a perspective view schematically illustrating a reaction tube of the substrate processing apparatus according to the embodiments described herein.

Subsequently, the reaction tube 4 will be described with reference to FIGS. 3 through 5. As shown in FIG. 3, the supply slits 4F configured to supply the process gas into the process chamber 6 are provided in the inner tube 4B. The supply slits 4F are arranged in a lattice pattern. That is, for example, the number of the supply slits 4F counted along the vertical direction (that is, the number of columns of the lattice pattern) is the same as the number of the wafers including the wafer 7, and the number of the supply slits 4F counted along the horizontal direction (that is, the number of rows of the lattice pattern) is three. An inner portion of the inner tube 4B (that is, the process chamber 6) is of a tubular shape (that is, forms a tubular space) whose inner diameter is 104% to 108% of the diameter of the largest wafer that can be accommodated in the process chamber 6. A plurality of partition plates (also simply referred to as "partition plates") 41 extending in the vertical direction are provided so as to partition the exhaust space S between the outer tube 4A and the inner tube 4B. The partition plates 41 are arranged circumferentially between the supply slits 4F or at both ends of the supply slits 4F. Sections separated from the exhaust space S by the partition plates 41 may constitute the nozzle chambers (also referred to as "supply buffers") 42. The nozzle chambers 42 serve as a plurality of supply chambers (also simply referred to as "supply chambers"). That is, the nozzle chambers 42 are formed by a part of the side portion of the inner tube 4B being projected outward. The nozzle chambers 42 are provided outside a side surface of the process chamber 6, and extend in parallel with the predetermined axis. As a result, the horizontal cross-section of the exhaust space S is of a C shape. In the vicinity of the process region A, only the supply slits 4F directly communicate with the nozzle chambers 42 and the inside of the inner tube 4B. According to the embodiments, the nozzle chambers 42 and the exhaust space S may be configured to be inseparable from the process chamber 6. That is, the nozzle chambers 42, the exhaust space S and the process chamber 6 may be formed as a single body.

The partition plates 41 are connected to the inner tube 4B. However, in order to avoid the stress caused by a temperature difference between the outer tube 4A and the inner tube 4B, the partition plates 41 may not to be directly connected to the outer tube 4A, and a slight gap may be provided between the partition plates 41 and the outer tube 4A. The nozzle chambers 42 may not be completely isolated from the exhaust space S. For example, one or more openings or gaps communicating with the exhaust space S and the nozzle chambers 42 may be provided at the nozzle chambers 42, particularly at upper ends and lower ends of the nozzle chambers 42. Outer peripheral sides of the nozzle chambers 42 may be partitioned by the outer tube 4A. However, the configuration of the nozzle chambers 42 is not limited thereto. For example, a partition plate extending along an inner surface of the outer tube 4A may be separately provided to constitute outer boundaries of the nozzle chambers 42.

In the inner tube 4B, the intermediate exhaust opening 4G and the supply chamber exhaust port 4L are provided at such positions to open toward a side surface of the heat insulating assembly 22. The intermediate exhaust opening 4G is oriented in the same direction as the exhaust outlet 4D, and is disposed at such a height that at least a part of an opening thereof overlaps a pipe of the exhaust outlet 4D. That is, the intermediate exhaust opening 4G is located on an extension line of a pipe shaft of the exhaust outlet 4D. The supply chamber exhaust port 4L is disposed at a position facing the intermediate exhaust opening 4G.

Figure 4:
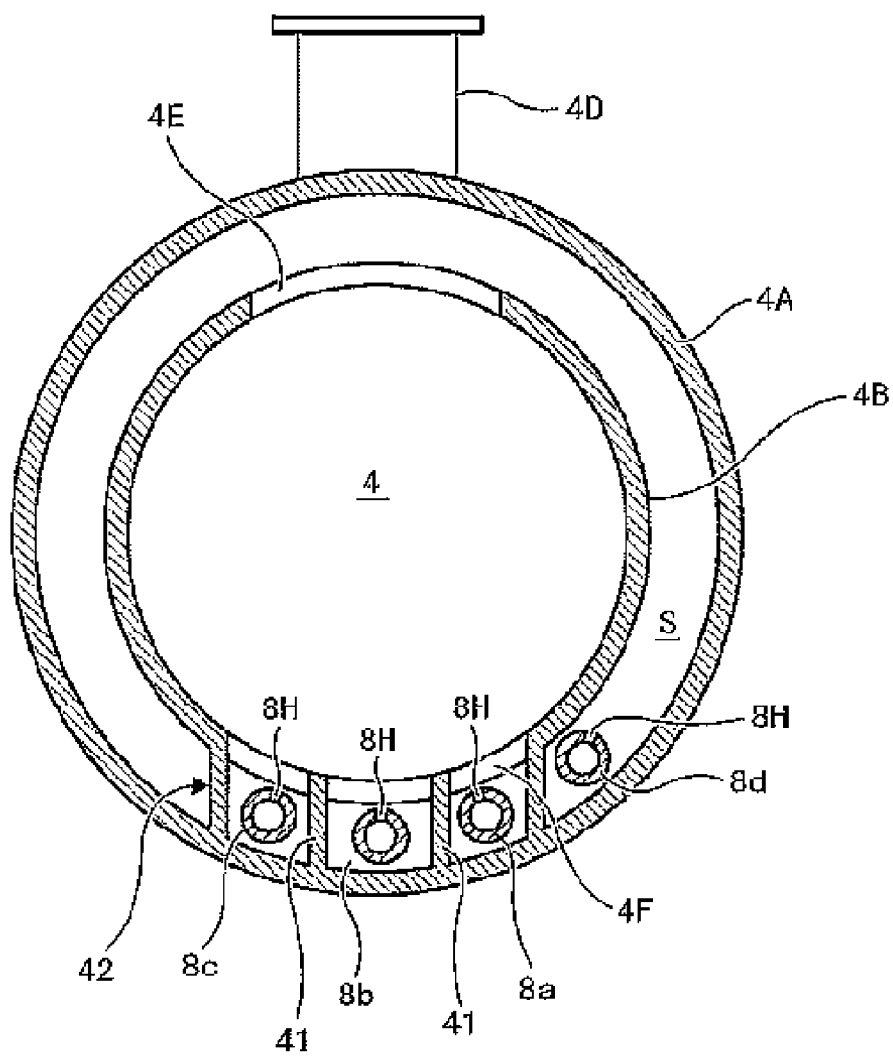
FIG. 4 schematically illustrates a horizontal cross-section of the reaction tube of the substrate processing apparatus according to the embodiments described herein.

As shown in FIG. 4, for example, nozzles 8a through 8c are installed in the nozzle chambers (for example, three nozzle chambers) 42, respectively. The nozzle holes 8H, which are open toward the center of the reaction tube 4, are provided on the side surfaces of the nozzles 8a through 8c, respectively. Although the gas ejected through the nozzle holes 8H is intended to flow from the supply slits 4F into the inner tube 4B, a part of the gas may not flow directly into the inner tube 4B.

As shown in FIG. 1, gas suppliers constituted by the gas supply pipe 9, the valve 11, the MFC 10, the gas supply pipe 12, the valve 14 and the MFC 13 are connected to the nozzles 8a through 8c, respectively. It is possible to supply different gases to the nozzles 8a through 8c using the gas suppliers. Since the nozzles 8a through 8c are installed in independent spaces separated by the partition plates 41 (that is, the nozzles 8a through 8c are installed in an isolated state), it is possible to prevent the process gas supplied through the nozzles 8a through 8c from being mixed in the nozzle chambers 42. It is also possible to discharge the stagnated gas in the nozzle chambers 42 through the upper ends and the lower ends of the nozzle chambers 42 to the exhaust space S. With the configuration described above, it is possible to prevent the process gas from being mixed in the nozzle chambers 42 to form a film or to generate by-products. Only in FIG. 4 is shown a nozzle (also referred to as a "purge nozzle") 8d that can be installed as desired in the exhaust space S adjacent to the nozzle chambers 42 along an axial direction (vertical direction) of the reaction tube 4. Hereinafter, it is assumed that the purge nozzle 8d does not exist.

Figure 5:
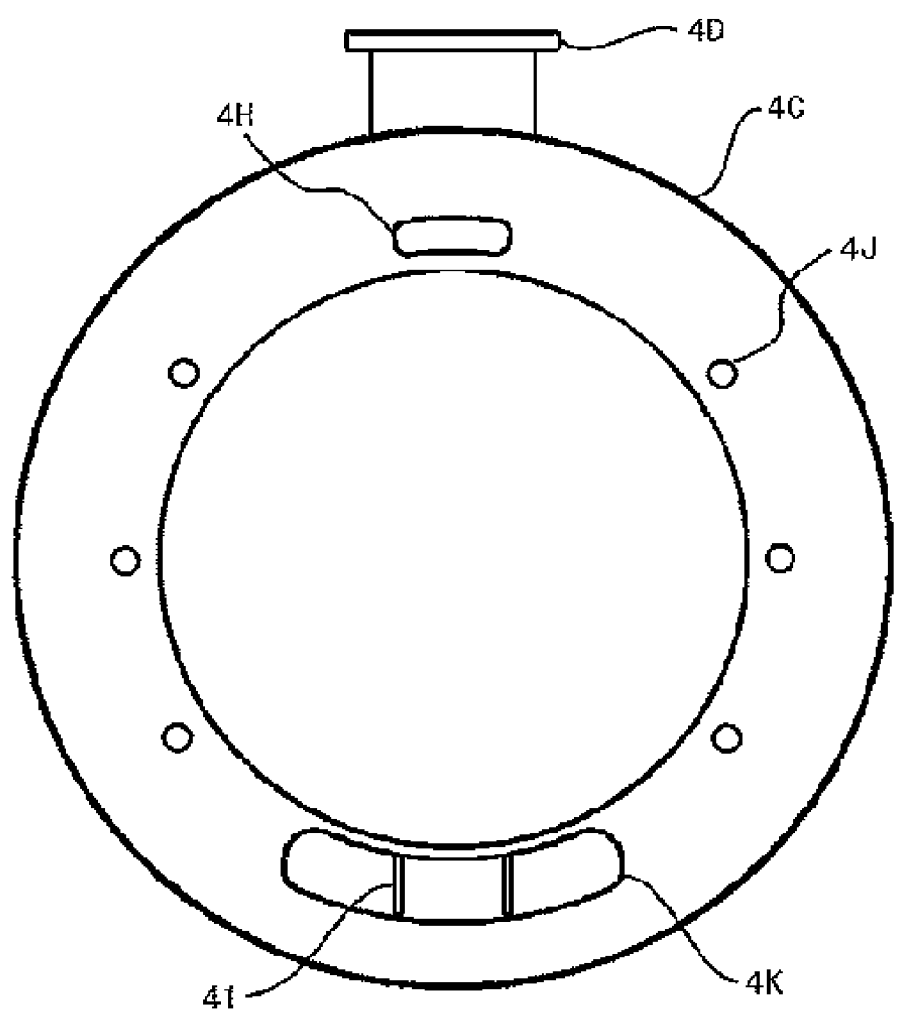
FIG. 5 is a bottom view schematically illustrating the reaction tube of the substrate processing apparatus according to the embodiments described herein.

As shown in FIG. 5, the flange 4C is provided with the bottom exhaust port 4H, the bottom exhaust ports 4J and the nozzle introduction hole 4K serving as openings that connect the exhaust space S and a lower portion of the flange 4C. The bottom exhaust port 4H is a long hole provided at a location closest to the exhaust outlet 4D, and each of the bottom exhaust ports 4J is a small hole. For example, the bottom exhaust ports (for example, six bottom exhaust ports) 4J are provided at six locations along the exhaust space S of a C shape. The nozzle 8 (that is, the nozzles 8a through 8c) is inserted into the nozzle introduction hole 4K through an opening of the nozzle introduction hole 4K. As shown in FIG. 1, the nozzles 8a through 8c may be closed by a nozzle introduction hole cover 8S. For example, the nozzle introduction hole cover 8S is made of quartz. When an opening of each of the bottom exhaust ports 4J is too large as will be described later, a flow velocity of the shaft purge gas passing therethrough may decrease, and the gas such as the source gas may enter the furnace opening from the exhaust space S by diffusion. Considering this, each of the bottom exhaust ports 4J may be configured as a hole with a reduced diameter at a center thereof (that is, a constricted hole).

Figure 6:
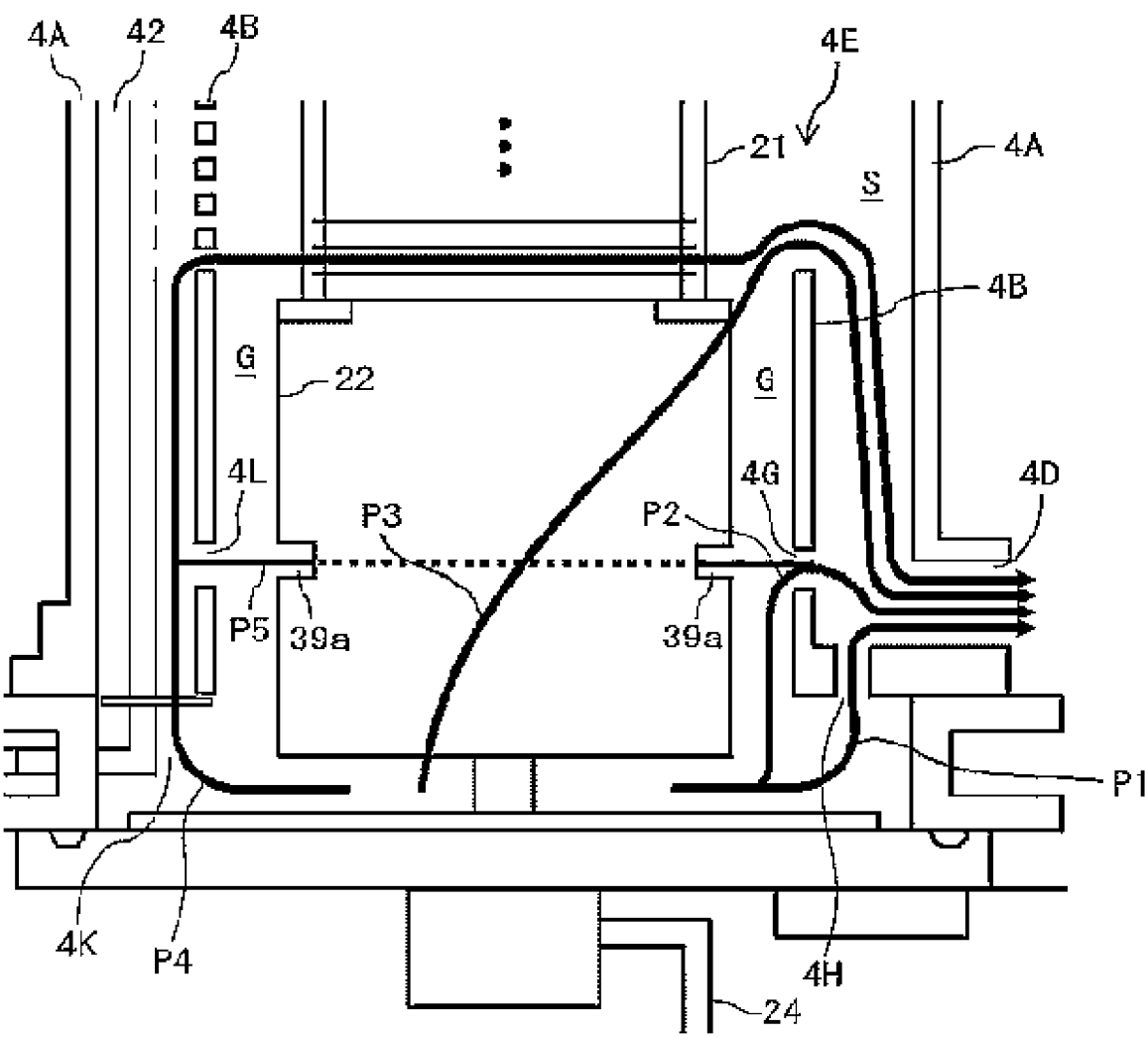
FIG. 6 schematically illustrates a flow of a shaft purge gas in the substrate processing apparatus according to the embodiments described herein.

Subsequently, discharge paths of the shaft purge gas will be described with reference to FIG. 6. The shaft purge gas supplied through the gas supply pipe 24 flows in a radial direction through the gap h1 between the rotating table 37 and the cover plate 20 while forming a diffusion barrier, and is discharged to the furnace opening. At the furnace opening, the shaft purge gas suppresses the flow of the source gas into the furnace opening, dilutes the source gas that has entered the furnace opening by the diffusion, and discharges the source gas with the flow of the shaft purge gas. As a result, it is possible to prevent the by-products from adhering to the furnace opening or from deteriorating. For example, there are five discharge paths of the shaft purge gas as follows.

Path P1: the shaft purge gas enters the exhaust space S through the bottom exhaust port 4H or the bottom exhaust ports 4J, and reaches the exhaust outlet 4D.

Path P2: the shaft purge gas passes through the gap G between the inner tube 4B and the heat insulating assembly 22, enters the exhaust space S through the intermediate exhaust opening 4G, and reaches the exhaust outlet 4D.

Path P3: the shaft purge gas enters the process region A through the gap G between the inner tube 4B and the heat insulating assembly 22, enters the exhaust space S through the main exhaust opening 4E, and reaches the exhaust outlet 4D.

Path P4: the shaft purge gas enters the nozzle chambers 42 through the nozzle introduction hole 4K, crosses the process region A, enters the exhaust space S through the main exhaust opening 4E, and reaches the exhaust outlet 4D.

Path P5: the shaft purge gas enters the nozzle chambers 42 through the nozzle introduction hole 4K, passes through the supply chamber exhaust port 4L, the gap G between the inner tube 4B and the heat insulating assembly 22, and the constriction 39a of the heat insulating assembly 22, enters the exhaust space S through the intermediate exhaust opening 4G, and reaches the exhaust outlet 4D.

The paths P3 and P4 through which the shaft purge gas flows into the process region A are not desirable for processing the substrate (that is, the wafer 7) because a concentration of the process gas may decrease below the process region A so that a uniformity among the substrates (that is, the wafers including the wafer 7) may be lowered. In particular, the reaction tube 4 of the present embodiments has a feature that a pressure loss of the main exhaust opening 4E is small, so that the shaft purge gas may be easily drawn into the paths P3 and P4. If neither the nozzle introduction hole cover 8S nor the bottom exhaust ports 4J is provided, the shaft purge gas would flow exclusively through the path P4. Therefore, according to the present embodiments, by enlarging an opening of the intermediate exhaust opening 4G and by reducing the gap G, the shaft purge gas flows more easily through the path P2 than through the path P3. Further, by providing the path P5, the shaft purge gas flows more easily through the path P5 than through the path P4. In addition, by adjusting the opening of the nozzle introduction hole 4K to be substantially small, it becomes difficult for the shaft purge gas to flow through the path P4 if, for example, the nozzle introduction hole 4K is closed by the nozzle introduction hole cover 8S. When the process gas and the shaft purge gas are allowed to flow, a preferred pressure gradient is formed on a side surface of the cylinder 39 due to the intermediate exhaust opening 4G. That is, when the process gas and the shaft purge gas are flowing, a preferred pressure gradient, where the pressure is high near the process region A and near the furnace opening and the pressure is lowest in the vicinity of the intermediate exhaust opening 4G, is formed on the side surface of the cylinder 39. According to the preferred pressure gradient, it is possible to suppress both the flow of the shaft purge gas into the process region A by the path P3 and the flow (diffusion) of the process gas into the furnace opening. When the supply of the shaft purge gas is excessive, a pressure loss in the path P1 or in the path P2 may increase, and the pressure gradient may be deteriorated.

The process gas such as a cleaning gas tends to stagnate at an innermost portion of the exhaust space S of a C shape since the innermost portion of the exhaust space S is in contact with and closed by the nozzle chambers 42. However, the process gas can be circulated in the exhaust space S and the furnace opening by the bottom exhaust ports 4J. When an amount of the shaft purge gas is large (that is, the pressure near the furnace opening is high), the shaft purge gas enters the exhaust space S through the path P3 to eliminate the stagnation of the process gas. Conversely, when the amount of the shaft purge gas is small, the process gas flows or diffuses into the exhaust space S and is discharged through the bottom exhaust port 4H. In both cases, it contributes to the exhaust of the stagnated gas in the exhaust space S. In addition, when an amount of the stagnated gas in the exhaust space S is very small, there is no problem because the stagnated gas in the exhaust space S is sufficiently diluted even if it enters the furnace opening.

However, when each of the bottom exhaust ports 4J is increased in size and a conductance of the path of P1 is increased too much, a maximum flow velocity of the shaft purge gas decreases in all paths including the path P1, and the process gas may easily enter the furnace opening by the diffusion in a direction against the flow thereof.

In summary, it is preferable that a conductance of the path P4 and a conductance of the path P3 are set to be lower than each of the conductance of the path P1, a conductance of the path P2 and a conductance of the path P5, and that upper limits of the conductance of the path P1 and the conductance of the path P2 are set such that the amount of the process gas entering the furnace opening is below an allowable amount. A purge gas supplied to a lower portion of the heat insulating assembly 22 is discharged to the exhaust outlet (exhaust port) 4D along: a first path that the purge gas flows from openings at bottoms of the nozzle chambers 42 to the exhaust space S sequentially via the nozzle chambers 42, the supply slits 4F, a vicinity of the wafers and the main exhaust opening 4E; a second path that the purge gas flows from a periphery of the heat insulating assembly 22 to the exhaust space S; or a third path that the purge gas flows from the openings at the bottoms of the Sic nozzle chambers 42 to the exhaust space S sequentially via the nozzle chambers 42, the supply chamber exhaust port 4L, a periphery of the constriction 39a and the intermediate exhaust opening 4G. A conductance of the first path is greater than a conductance of the second path, and the conductance of the first path is smaller than a conductance of the third path.

Figure 7:
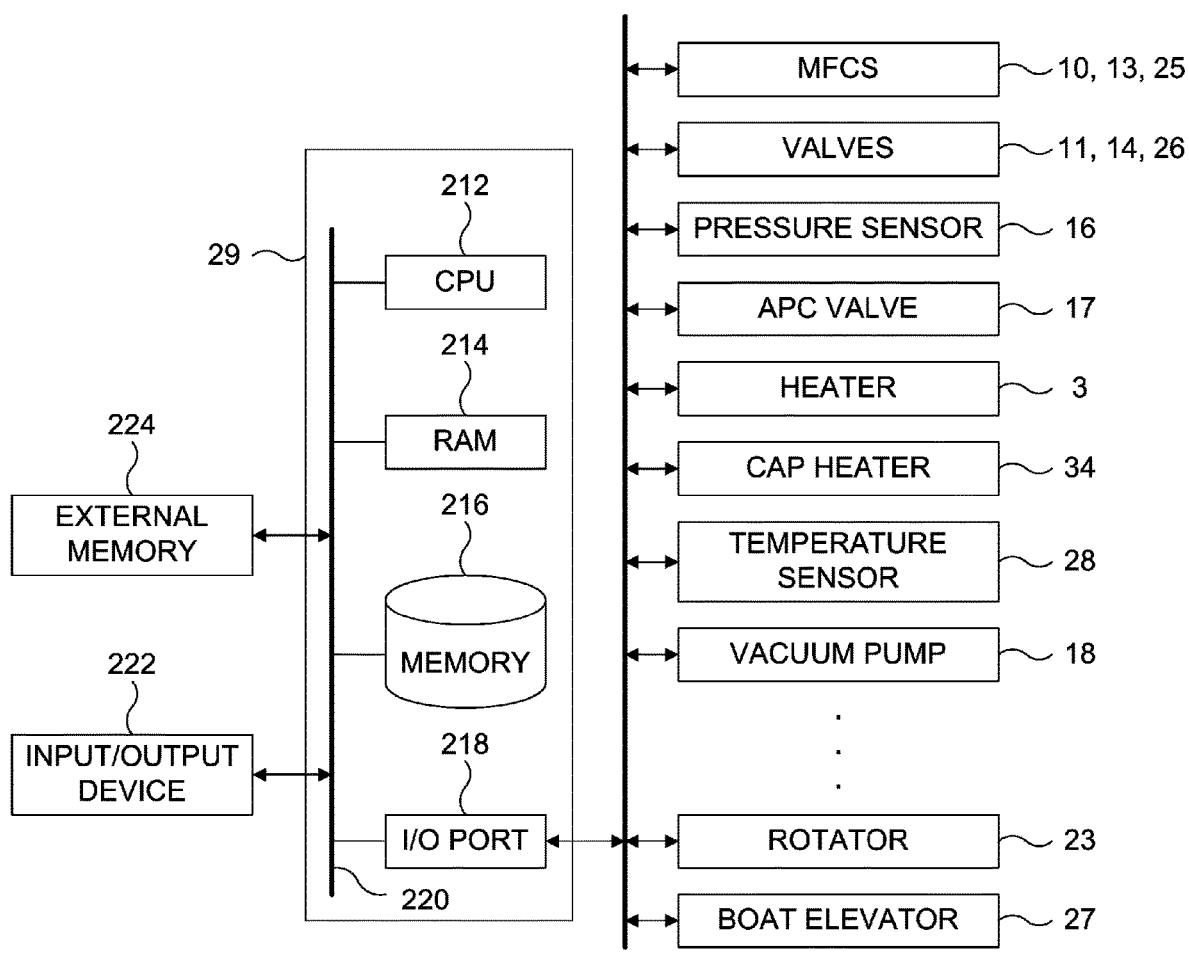
FIG. 7 is a block diagram schematically illustrating a configuration of a controller and related components of the substrate processing apparatus according to the embodiments described herein.

Subsequently, the controller 29 will be described with reference to FIG. 7. The controller 29 is electrically connected to the components of the substrate processing apparatus 1 such as the MFCs 10, 13 and 25, the valves 11, 14 and 26, the pressure sensor 16, the APC valve 17, the vacuum pump 18, the heater 3, the cap heater 34, the temperature sensor 28, the rotator 23 and the boat elevator 27, and is configured to control the components electrically connected thereto. The controller 29 is constituted by a computer including a CPU (Central Processing Unit) 212, a RAM (Random Access Memory) 214, a memory 216 and an I/O port 218. The RAM 214, the memory 216 and the I/O port 218 may exchange data with the CPU 212 through an internal bus 220. The I/O port 218 is connected to the components described above. For example, an input/output device 222 such as a touch panel is connected to the controller 29.

The memory 216 is configured by components such as a flash memory and a hard disk drive (HDD). For example, a control program for controlling the operation of the substrate processing apparatus 1 or a program (for example, a recipe such as a process recipe and a cleaning recipe) configured to control the components of the substrate processing apparatus 1 according to the process conditions to perform a substrate processing such as a film-forming process is readably stored in the memory 216. The RAM 214 functions as a memory area (work area) where a program or data read by the CPU 212 is temporarily stored.

The CPU 212 is configured to read the control program from the memory 216 and execute the read control program. In addition, the CPU 212 is configured to read the recipe from the memory 216 according to an operation command inputted from the input/output device 222. According to the contents of the read recipe, the CPU 212 is configured to control the components of the substrate processing apparatus 1.

The controller 29 may be embodied by installing the above-described program stored in an external memory 224 in a non-transitory manner into a computer. For example, the external memory 224 may include a semiconductor memory such as a USB memory and a memory card, an optical disk such as a CD and a DVD and a hard disk drive (HDD). The memory 216 or the external memory 224 may be embodied by a non-transitory tangible computer readable recording medium. Hereafter, the memory 216 and the external memory 224 may be collectively or individually referred to as "recording medium". Instead of the external memory 224, a communication means such as the Internet and a dedicated line may be used for providing the program to the computer.

Hereinafter, an exemplary sequence of the substrate processing (that is, the film-forming process) of forming a film on the substrate (that is, the wafer 7), which is a part of manufacturing processes of a semiconductor device, will be described with reference to FIG. 8. The exemplary sequence of the substrate processing is performed using the substrate processing apparatus 1.

The exemplary sequence of the substrate processing will be described by way of an example in which a silicon nitride film (SiN film) is formed on the wafer 7 by respectively supplying hexachlorodisilane (HCDS) gas serving as a first process gas (also referred to as the "source gas") to the wafer 7 through the nozzle 8a and ammonia ($NH_3$) gas serving a second process gas (also referred to as a "reactive gas") to the wafer 7 through the nozzle 8b. According to the example, at least two nozzles including the nozzle 8a and the nozzle 8b are provided as the nozzle 8. In the following descriptions, the operations of the components constituting the substrate processing apparatus 1 are controlled by the controller 29.

According to the exemplary sequence of the substrate processing (that is, the film-forming process) of the present embodiments, the SiN film is formed on the wafer 7 by performing a cycle a predetermined number of times (at least once). For example, the cycle may include: supplying the HCDS gas to the wafer 7 in the process chamber 6; removing the HCDS gas (residual gas) from the process chamber 6; supplying the $NH_3$ gas to the wafer 7 in the process chamber 6; and removing the NH₃ gas (residual gas) from the process chamber 6. In the present specification, the exemplary sequence of the film-forming process according to the embodiments may be represented as follows:

(HCDS→NH₃)×n=>SiN

Wafer Charging and Boat Loading Step

The wafers including the wafer 7 are charged (transferred) into the boat 21 (wafer charging step). After the boat 21 is charged with the wafers, the boat 21 charged with the wafers is elevated by the boat elevator 27 and loaded (transferred) into the process chamber 6 (boat loading step). With the boat 21 loaded, the seal cap 19 seals the lower end opening of the manifold 5 via the O-ring 19A. From a standby state before the wafer charging step, the valve 26 may be opened to supply a small amount of the shaft purge gas into the cylinder 39.

Pressure Adjusting Step

The vacuum pump 18 exhausts (vacuum-exhausts) the inner atmosphere of the process chamber 6 until the inner pressure of the process chamber 6 in which the wafers including the wafer 7 are accommodated reaches a predetermined pressure (vacuum degree). In the pressure adjusting step, the inner pressure of the process chamber 6 is measured by the pressure sensor 16, and the APC valve 17 is feedback-controlled based on the measured pressure information. The shaft purge gas is continuously supplied into the cylinder 39 and the inner atmosphere of the process chamber 6 is continuously exhausted by the vacuum pump 18 until at least the processing of the wafer 7 is completed.

Temperature Elevating Step

After the inner atmosphere (for example, oxygen) of the process chamber 6 is sufficiently exhausted from the process chamber 6, the inner temperature of the process chamber 6 is elevated. The states of the electric conduction to the heater 3 and the cap heater 34 are feedback-controlled based on the temperature information detected by the temperature sensor 28 so as to obtain a desired temperature distribution of the inner temperature of the process chamber 6 adapted to performing a film-forming step described later. The heater 3 and the cap heater 34 continuously heat the process chamber 6 until at least the processing (the film-forming process) of the wafer 7 is completed. The time duration of supplying the electrical power to the cap heater 34 may not be equal to the time duration of supplying the electrical power to the heater 3. Immediately before the start of the film-forming step, it is preferable that a temperature of the cap heater 34 reaches the same temperature as a film-forming temperature, and an inner surface temperature of the manifold 5 reaches 180° C. or higher (for example, 260° C.).

In the temperature elevating step, the boat 21 and the wafers including the wafer 7 are rotated by the rotator 23. The boat 21 is rotated by the rotator 23 via the rotating shaft 36, the rotating table 37, and the cylinder 39. Therefore, it is possible to rotate the wafers including the wafer 7 without rotating the cap heater 34. Thereby, uneven heating is reduced. As a result, it is possible to uniformly heat the wafers. The rotator 23 continuously rotates the boat 21 and the wafers until at least the processing of the wafer 7 is completed.

Film-Forming Step

Figure 8:
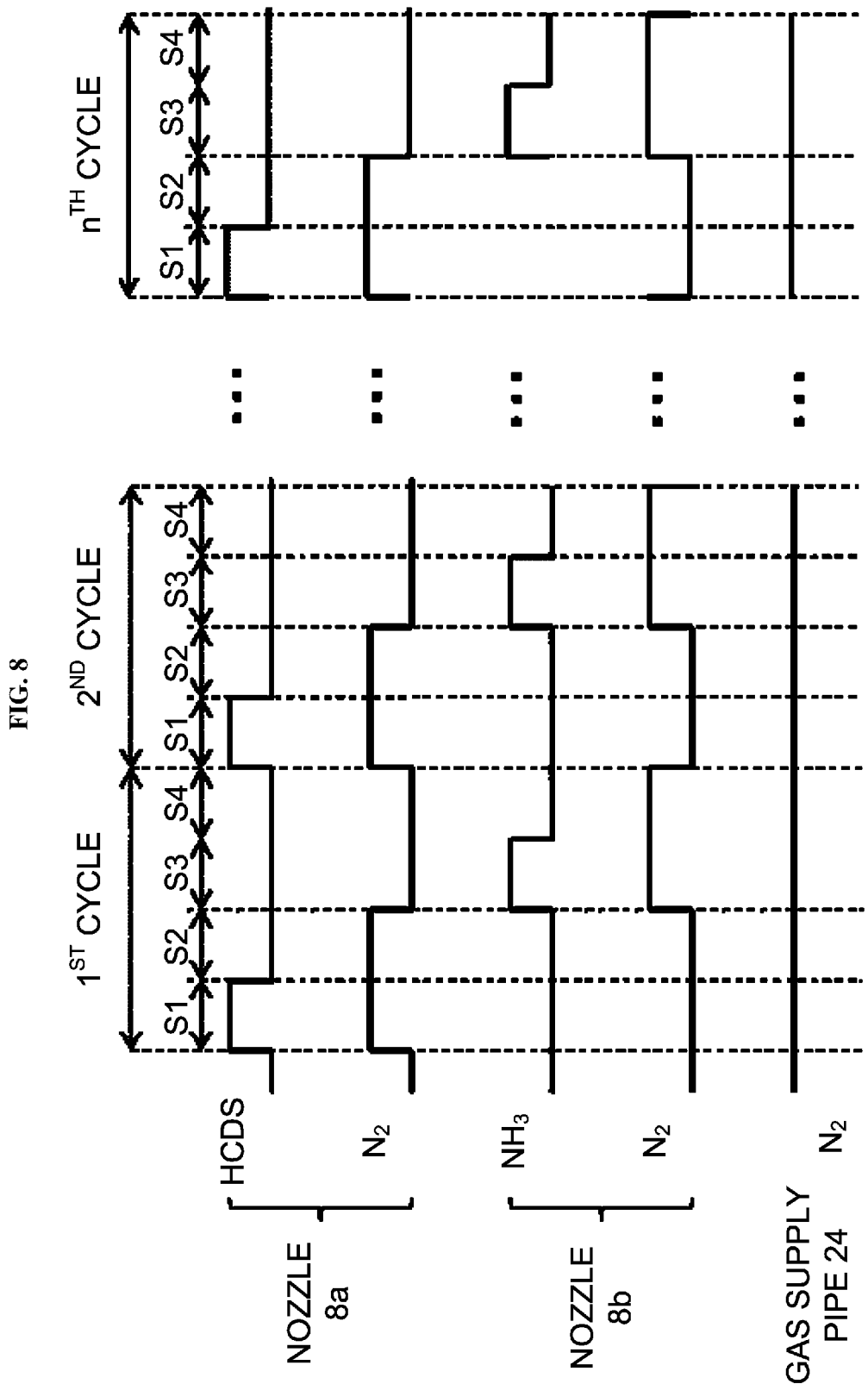
FIG. 8 is a flow chart schematically illustrating a film-forming sequence according to the embodiments described herein.

After the inner temperature of the process chamber 6 is stabilized at a predetermined processing temperature, as shown in FIG. 8, the film-forming step is performed by performing (repeating) a step S1 through a step S4 described below sequentially. In addition, before starting the step S1, the valve 26 may be opened to increase the supply of the shaft purge gas.

Step S1: Source Gas Supply Step

In the step S1, the HCDS gas is supplied to the wafer 7 in the process chamber 6. By opening of the valve 11 and the valve 14, the HCDS gas is supplied into the gas supply pipe 9 and the N₂ gas is supplied into the gas supply pipe 12. The flow rates of the HCDS gas and the N₂ gas are adjusted by the MFCs 10 and 13, respectively. The HCDS gas and the N₂ gas with the flow rate thereof adjusted respectively are supplied to the wafer 7 in the process chamber 6 through the nozzle 8a, and are exhausted through the exhaust pipe 15. By supplying the HCDS gas to the wafer 7 in the process chamber 6, a silicon-containing layer whose thickness is, for example, within a range from a single atomic layer or less to several atomic layers is formed as a first layer on an outermost surface of the wafer 7.

Step S2: Source Gas Exhaust Step

After the first layer is formed, the valve 11 is closed to stop the supply of the HCDS gas into the process chamber 6. In the step S2, by maintaining the APC valve 17 open, the vacuum pump 18 vacuum-exhausts the inner atmosphere of the process chamber 6 to remove the HCDS gas remaining in the process chamber 6 which did not react or which contributed to the formation of the first layer from the process chamber 6. In addition, by maintaining the valve 14 or the valve 26 open, the N₂ gas may be supplied to purge the gas supply pipe 9, the reaction tube 4 or the furnace opening.

Step S3: Reactive Gas Supply Step

In the step S3, the NH₃ gas is supplied to the wafer 7 in the process chamber 6. Valves (not shown) through which the NH₃ gas and the N₂ gas are supplied are controlled in the same manner as the valves 11 and 14 in the step S1. The flow rates of the NH₃ gas and the N₂ gas are adjusted by MFCs (not shown), respectively. The NH₃ gas and the N₂ gas with the flow rate thereof adjusted respectively are supplied to the wafer 7 in the process chamber 6 through the nozzle 8b, and are exhausted through the exhaust pipe 15. The NH₃ gas supplied to the wafer 7 reacts with at least a portion of the first layer (that is, the silicon-containing layer) formed on the wafer 7 in the step S1. As a result, the first layer is modified (nitrided) into a second layer containing silicon (Si) and nitrogen (N), that is, a silicon nitride layer (SiN layer).

Step S4: Reactive Gas Exhaust Step

After the second layer is formed, the valve (not shown) through which the NH₃ gas is supplied is closed to stop the supply of the NH₃ gas into the process chamber 6. Similar to the step S2, the vacuum pump 18 vacuum-exhausts the inner atmosphere of the process chamber 6 to remove the by-products or the NH₃ gas remaining in the process chamber 6 which did not react or which contributed to the formation of the second layer from the process chamber 6.

By performing the cycle wherein the step S1 through the step S4 described above are performed non-simultaneously (without overlapping) in order a predetermined number of times (n times), the SiN film is formed on the wafer 7 with a predetermined composition and a predetermined thickness.

For example, the process conditions for the exemplary sequence of the substrate processing are as follows:

Processing Temperature (wafer temperature): 250° C. to 700° C.;
Processing Pressure (the inner pressure of the process chamber): 10 Pa to 4,000 Pa;
Flow rate of the HCDS gas: 1 sccm to 2,000 sccm;
Flow rate of the NH₃ gas: 100 sccm to 10,000 sccm;

Flow rate of the $N_2$ gas (to the nozzles): 100 sccm to 10,000 sccm; and

Flow rate of the $N_2$ gas (to the rotating shaft): 100 sccm to 500 sccm

By selecting suitable values within these process conditions described above, it is possible to perform the substrate processing (film-forming process) properly.

A thermally decomposable gas such as the HCDS may form a film of the by-products on a surface of a metal more easily than on a surface of quartz. The film of the by-products containing materials such as silicon oxide (SiO) and silicon oxynitride (SiON) may be easily adhered to a surface exposed to the HCDS gas (and the ammonia gas), particularly when the temperature of the surface is 260° C. or lower.

Purging and Returning to Atmospheric Pressure Step

After the film-forming step is completed, by opening the valve 14 and the valve (not shown) through which the $N_2$ gas is supplied, the $N_2$ gas is supplied into the process chamber 6 through each of the gas supply pipe 12 and a gas supply pipe (not shown) through which the $N_2$ gas is supplied, and then the $N_2$ gas supplied into the process chamber 6 is exhausted through the exhaust pipe 15. The inner atmosphere of the process chamber 6 is replaced with the $N_2$ gas which is the inert gas (substitution by inert gas), and thus the gas such as the source gas remaining in the process chamber 6 or the reaction by-products remaining in the process chamber 6 are removed (purged) from the process chamber 6 (purging step). Thereafter, the APC valve 17 is closed, and the $N_2$ gas is filled in the process chamber 6 until the inner pressure of the process chamber 6 reaches a normal pressure (returning to atmospheric pressure step).

Boat Unloading and Wafer Discharging Step

Thereafter, the seal cap 19 is lowered by the boat elevator 27 and the lower end of the manifold 5 is opened. The boat 21 with the processed wafers including the wafer 7 charged therein is unloaded out of the reaction tube 4 through the lower end of the manifold 5 (boat unloading step). Then, the processed wafers including the wafer 7 are transferred (discharged) from the boat 21 (wafer discharging step).

When the film-forming process described above is performed, a film may be formed on heated surfaces of components in the reaction tube 4 by depositing deposits such as the SiN film containing nitrogen. For example, the film may be formed on an inner wall of the outer tube 4A, a surface of the nozzle 8a, a surface of the inner tube 4B and a surface of the boat 21. Therefore, a cleaning process is performed when an amount of the deposits (that is, an accumulated thickness of the film formed on the heated surfaces of the components) reaches a predetermined amount (thickness) before the deposits are peeled off or fall off. The cleaning process is performed by supplying, for example, $F_2$ gas serving as a fluorine-based gas into the reaction tube 4.

Subsequently, a model of an exhaust path in the reaction tube 4 will be described with reference to FIG. 9. The model represents a simplified exhaust path. For example, a fluid resistance (hereinafter simply referred to as "resistance") for the process gas ejected through the main exhaust opening 4E to flow downward in the exhaust space S is included in a resistance of the main exhaust opening 4E. A resistance for the shaft purge gas ejected through the intermediate exhaust opening 4G or the bottom exhaust ports 4J to flow in a lateral direction in the exhaust space S is included in a resistance of the intermediate exhaust opening 4G or a resistance of the bottom exhaust ports 4J. Referring to FIG. 9, the shaft purge gas from the gas supply pipe 24 is supplied substantially uniformly over an entire circumference of the furnace opening. In addition, most of the process gas from the nozzle 8 is usually sucked into the exhaust outlet 4D through the supply slits 4F and the main exhaust opening 4E. A portion closer to the exhaust outlet 4D corresponds to the exhaust space S rather than the main exhaust opening 4E, the intermediate exhaust opening 4G, the bottom exhaust port 4H and the bottom exhaust ports 4J.

Since the intermediate exhaust opening 4G and the bottom exhaust port 4H are distanced apart from a main exhaust path of the process gas, a pressure in the vicinity of the intermediate exhaust opening 4G or the bottom exhaust port 4H is as low as that of the exhaust outlet 4D, and the gas is drawn toward the exhaust outlet 4D. Therefore, the intermediate exhaust opening 4G forms an upward flow of the shaft purge gas flows in a lower portion of the gap G, and the bottom exhaust port 4H functions as a drain of discharging the surplus shaft purge gas in the furnace opening which remains there or has already contributed to the dilution of the process gas.

A conductance of the main exhaust opening 4E, a conductance of the gap G and the flow rate of the shaft purge gas may be set so that an inner pressure of the inner tube 4B of the main exhaust opening 4E is substantially the same as or slightly lower than an inner pressure of the main exhaust opening 4E. Since the conductance and the pressure difference (total pressure) are both small at an upper portion of the gap G, the movement of gas molecules is suppressed. That is, although there is a concentration difference of the gas such as the shaft purge gas in the vertical direction in the gap G, the amount of the gas advection or the gas diffusion is small because a cross-sectional area of the gap G is small and the distance (length) of the gap G is long. In the lower portion of the gap G, the diffusion barrier is formed by the upward flow of the shaft purge gas, so that the process gas having diffused to the intermediate exhaust opening 4G is exhausted along with the flow of the shaft purge gas toward the exhaust outlet 4D.

Since there is no other highly resistant location in a path along which the shaft purge gas flows from the bottom exhaust ports 4J to the lower end of the exhaust space S, the flow rate of the shaft purge gas is determined by the conductance of the bottom exhaust ports 4J itself set to be relatively small. By ejecting the shaft purge gas into the lower end of the exhaust space S, it is possible to generate the gas advection and the gas stirring in a blocked portion of the exhaust space S whose cross section is of a C shape. As a result, it is possible to effectively purge the process gas and the cleaning gas having stagnated at the blocked portion. When the flange 4C is provided without the bottom exhaust ports 4J, it may be difficult to purge the blocked portion of the exhaust space S, which is a dead end, and it may require many times of repetition of performing the pressure swing described above.

When a conductance of the nozzle introduction hole 4K is set to a significant value larger than substantially zero (0), a gentle flow in the vertical direction is generated in the nozzle chambers 42. In particular, when the upper ends of the nozzle chambers 42 are also opened slightly, it is possible to facilitate the gas replacement in the nozzle chambers 42 by the gentle flow in the vertical direction while suppressing the influence on the gas distribution in the process region A. In general, from the viewpoint of preventing the source gas from entering the furnace opening, it is preferable to set the flow rate of the shaft purge gas such that the shaft purge gas flows slightly upward through the nozzle introduction hole 4K. When the bottom exhaust port 4H and the bottom exhaust ports 4J are excessively large in size, the flow rate of the shaft purge gas should be higher. The shaft purge gas flowing along a path from the supply chamber exhaust port 4L into of the inner tube 4B joins the shaft purge gas flowing along the vertical direction of the gap G, and then is exhausted through the intermediate exhaust opening 4G.

When the nozzle 8 is configured to supply a gas other than the source gas, it is possible to easily increase the conductance of the nozzle introduction hole 4K. For example, when the nozzle 8 is configured to supply the same kind of a purge gas ($N_2$) as the shaft purge gas, the purge gas may flow upward or downward through the nozzle introduction hole 4K by controlling the flow rates (or pressures) of both the purge gas and the shaft purge gas. In general, the flow rate of the shaft purge gas is set equal to or greater than a predetermined value. Therefore, when the purge gas from the nozzle 8 is increased, the purge gas overflowing from the nozzle chambers 42 flows to the supply chamber exhaust port 4L through the nozzle introduction hole 4K, then flows into the exhaust space S through the intermediate exhaust opening 4G or the bottom exhaust ports 4J, and may contribute to the purging of the stagnated gas in the exhaust space S.

According to the present embodiments, it is possible to provide at least one or more of the following effects.

(a) By providing the intermediate exhaust opening 4G, the supply chamber exhaust port 4L and the constriction 39a, the purge gas (that is, the shaft purge gas) that has flowed into the inner tube 4B is allowed to spontaneously flow into the exhaust space S between the outer tube 4A and the inner tube 4B. Therefore, it is possible to reduce the flow rate of the shaft purge gas that flows into the process region A.

(b) By providing the supply chamber exhaust port 4L and the constriction 39a at the same height as the intermediate exhaust opening 4G, the particles can be drawn into a exhaust side such as the exhaust outlet 4D even when the cracks of the film are rolled up at the lower portion of the furnace opening and the particles fall on the substrates (wafers) due to sudden pressure fluctuations such as pressure fluctuations in the vicinity of the furnace opening.

Other Embodiments

While the technique is described by way of the above-described embodiments, the above-described technique is not limited thereto. The above-described technique may be modified in various ways without departing from the gist thereof. For example, the embodiments are described by way of an example in which the outer tube 4A and the inner tube 4B of the reaction tube 4 are formed as a single body. However, the reaction tube 4 is not limited thereto. The outer tube 4A and the inner tube 4B may be provided as separate components and mounted on the manifold 5. When the outer tube 4A and the inner tube 4B are provided as the separate components, openings between the exhaust space and the furnace opening in the vicinity of open ends of the outer tube 4A and the inner tube 4B correspond to the bottom exhaust port 4H and the bottom exhaust ports 4J. Alternatively, the outer tube 4A, the inner tube 4B and the manifold 5 may be made of quartz as a single body.

In addition, it is sufficient that the exhaust space S is configured as a space or a flow path capable of allowing the exhaust outlet 4D to fluidically communicate with the main exhaust opening 4E opened toward the wafers including the wafer 7. The space or the flow path described above may also be referred to as a "gas discharger" or a "gas discharge structure". The gas discharger is configured to fluidically communicate with the process chamber 6. The main exhaust opening 4E may be configured as one or more openings.

Similarly, a space or a flow path configured to fluidically communicate with the process chamber 6 through one or more openings bored (or drilled) toward a side portion (or edge) of each of the wafers 7 and configured to supply the gas flow (advection) to each of the wafers may also be referred to as a "gas supplier" or a "gas supply structure". The gas supplier may further include the nozzle chambers 42 or the nozzle 8.

The embodiments are described by way of an example in which the film-forming process of forming the film on the wafer is performed. However, the above-described technique is not limited thereto. For example, the above-described technique may be effectively applied to processes, for example, a modification process such as an oxidation process and a nitridation process, a diffusion process and an etching process when the cracks of the film is rolled up at the lower portion of the furnace opening and the particles fall on the substrates (wafers) due to sudden pressure fluctuations.

For example, the embodiments are described by way of an example in which the reaction tube 4 is embodied by the double tube structure including a pressure resistant cylindrical tube (that is the outer tube 4A), a non-pressure resistant liner tube (that is, the inner tube 4B) and a non-pressure resistant buffer (that is, the nozzle chambers 42). However, the reaction tube 4 is not limited thereto. For example, the reaction tube 4 may be embodied by a single tube structure including a pressure resistant cylindrical tube and a non-pressure resistant buffer.

According to some embodiments of the technique in the present disclosure, it is possible to reduce the particles at the lower portion of the furnace opening.

What is claimed is:

1. A substrate processing apparatus comprising:
 a substrate retainer configured to support a plurality of wafers arranged at a predetermined interval along a predetermined axis;
 a heat insulating assembly provided below the substrate retainer;
 a process chamber formed in a tubular shape and configured to accommodate the substrate retainer and the heat insulating assembly;
 a gas supplier configured to fluidically communicate with the process chamber through one or more openings bored toward an edge of each of the plurality of wafers in the process chamber;
 a gas discharger configured to fluidically communicate with the process chamber through one or more main exhaust openings bored toward the edge of each of the wafers;
 an exhaust port configured to communicate with the gas discharger and to discharge an inner atmosphere of the process chamber;
 an intermediate exhaust opening provided on a side wall of the process chamber and configured to communicate with the process chamber and the exhaust port at a position facing the heat insulating assembly; and
 a supply chamber exhaust port provided on the side wall of the process chamber and configured to communicate with the process chamber and the gas supplier at a height corresponding to the intermediate exhaust opening,
 wherein the heat insulating assembly is provided with a constriction at a position corresponding to the intermediate exhaust opening, and an outer diameter of the constriction is smaller than that of a portion of the heat insulating assembly above the position corresponding to the intermediate exhaust opening and that of another portion of the heat insulating assembly below the position corresponding to the intermediate exhaust opening, wherein the gas supplier comprises a plurality of supply chambers provided outside of a side surface of the process chamber, extending in parallel with the predetermined axis and configured to fluidically communicate with the process chamber through a plurality of supply openings bored on the side surface of the process chamber in a manner respectively corresponding to each of the wafers, the gas discharger comprises an exhaust chamber provided outside of the side surface of the process chamber at a position opposite to the plurality of supply chambers and configured to fluidically communicate with the process chamber through the one or more main exhaust openings bored on the side surface of the process chamber, the exhaust port is further configured to communicate with the exhaust chamber and to exhaust an inner atmosphere of the exhaust chamber, the intermediate exhaust opening is further configured to communicate with the process chamber and the exhaust chamber, and the supply chamber exhaust port is further configured to communicate with the process chamber and the plurality of supply chambers.

2. The substrate processing apparatus of claim 1, further comprising:
a plurality of injectors of a tubular shape installed by being inserted through openings at bottoms of the plurality of supply chambers and configured to supply a gas to the plurality of the wafers; and
a plurality of supply pipes through which each of the injectors communicates with a gas supply source corresponding thereto and provided outside the process chamber.

3. The substrate processing apparatus of claim 2, further comprising:
a purge gas supplier configured to supply a purge gas to a lower portion of the heat insulating assembly;
a flange formed as a single body on outer peripheries of lower ends of the process chamber, the plurality of supply chambers and the exhaust chamber;
a manifold of a cylindrical shape configured to support the flange and provided with an opening at a lower end thereof through which the substrate retainer is loaded or unloaded;
a lid configured to open or close the opening at the lower end of the manifold; and
a heater configured to heat the plurality of the wafers from outside the process chamber,
wherein the heat insulating assembly comprises a cylinder whose diameter is greater than a diameter of each of the wafers and smaller than an inner diameter of the process chamber.

4. The substrate processing apparatus of claim 1, wherein a purge gas supplied to a lower portion of the heat insulating assembly is discharged to the exhaust port along: a first path that the purge gas flows from openings at bottoms of the plurality of the supply chambers to the exhaust chamber sequentially via the plurality of the supply chambers, the plurality of the supply openings, a vicinity of the plurality of the wafers and the one or more main exhaust openings; a second path that the purge gas flows from a periphery of the heat insulating assembly to the exhaust chamber; or a third path that the purge gas flows from the openings at the bottoms of the plurality of the supply chambers to the exhaust chamber sequentially via the plurality of the supply chambers, the supply chamber exhaust port, a periphery of the constriction and the intermediate exhaust opening, and
a conductance of the first path is greater than a conductance of the second path, and the conductance of the first path is smaller than a conductance of the third path.

5. The substrate processing apparatus of claim 2, wherein a purge gas supplied to a lower portion of the heat insulating assembly is discharged to the exhaust port along: a first path that the purge gas flows from openings at the bottoms of the plurality of the supply chambers to the exhaust chamber sequentially via the plurality of the supply chambers, the plurality of the supply openings, a vicinity of the plurality of the wafers and the one or more main exhaust openings; a second path that the purge gas flows from a periphery of the heat insulating assembly to the exhaust chamber; or a third path that the purge gas flows from the openings at the bottoms of the plurality of the supply chambers to the exhaust chamber sequentially via the plurality of the supply chambers, the supply chamber exhaust port, a periphery of the constriction and the intermediate exhaust opening, and
a conductance of the first path is greater than a conductance of the second path, and the conductance of the first path is smaller than a conductance of the third path.

6. The substrate processing apparatus of claim 3, wherein the purge gas supplied to the lower portion of the heat insulating assembly is discharged to the exhaust port along: a first path that the purge gas flows from openings at the bottoms of the plurality of the supply chambers to the exhaust chamber sequentially via the plurality of the supply chambers, the plurality of the supply openings, a vicinity of the plurality of the wafers and the one or more main exhaust openings; a second path that the purge gas flows from a periphery of the heat insulating assembly to the exhaust chamber; or a third path that the purge gas flows from the openings at the bottoms of the plurality of the supply chambers to the exhaust chamber sequentially via the plurality of the supply chambers, the supply chamber exhaust port, a periphery of the constriction and the intermediate exhaust opening, and
a conductance of the first path is greater than a conductance of the second path, and the conductance of the first path is smaller than a conductance of the third path.

7. The substrate processing apparatus of claim 1, wherein the supply chamber exhaust port, a center of each of the wafers, the intermediate exhaust opening and the exhaust port are arranged in a straight line.

8. The substrate processing apparatus of claim 1, wherein the intermediate exhaust opening is located on an extension line of a pipe shaft of the exhaust port.

9. The substrate processing apparatus of claim 2, wherein the plurality of the injectors are configured to supply the gas through a plurality of discharge ports provided at a height equal to or higher than that of a lowermost wafer among the plurality of the wafers, and a flow rate of the gas is set such that a downward flow of the gas from each of the discharge ports to the supply chamber exhaust port is generated at a timing when a temporal fluctuation of a pressure in the process chamber is maximized during processing the plurality of the wafers.

10. The substrate processing apparatus of claim 1, wherein the heat insulating assembly whose bottom is detachable comprises a plurality of heat insulating plates or heat reflecting plates provided therein above or below the constriction, and a diameter of each of the heat insulating plates or the heat reflecting plates is smaller than an inner diameter of the constriction.

11. The substrate processing apparatus of claim 10, wherein the heat insulating assembly comprises an auxiliary heater provided above the plurality of the heat insulating plates or the heat reflecting plates provided above the constriction.

12. The substrate processing apparatus of claim 1, wherein the process chamber is of a tubular shape whose inner diameter is 104% to 108% of a diameter of a largest wafer accommodatable in the process chamber, and
   a first nozzle, a second nozzle and a third nozzle are accommodated in a plurality of supply buffers formed by a part of a side portion of the process chamber being projected outward in a state where the first nozzle, the second nozzle and the third nozzle are isolated from one another.

13. The substrate processing apparatus of claim 1, wherein the plurality of supply chambers and the exhaust chamber are configured to be inseparable from the process chamber.

* * * * *